United States Patent [19]
Mazzochette

[11] Patent Number: 5,834,991
[45] Date of Patent: Nov. 10, 1998

[54] THICK FILM LANGE COUPLER

[75] Inventor: Joseph B. Mazzochette, Cherry Hill, N.J.

[73] Assignee: EMC Technology, Inc., Cherry Hill, N.J.

[21] Appl. No.: 229,018

[22] Filed: Apr. 18, 1994

[51] Int. Cl.⁶ ...................................................... H01P 5/18
[52] U.S. Cl. .......................................... 333/116; 333/238
[58] Field of Search ................................... 333/116, 238, 333/246

[56] References Cited

U.S. PATENT DOCUMENTS

| | | | |
|---|---|---|---|
| 4,937,541 | 6/1990 | Podell et al. ............................. | 333/116 |
| 5,105,171 | 4/1992 | Wen et al. ................................ | 333/116 |

FOREIGN PATENT DOCUMENTS

| | | | |
|---|---|---|---|
| 259717 | 10/1993 | Japan ..................................... | 333/116 |

Primary Examiner—Paul Gensler
Attorney, Agent, or Firm—Donald S. Cohen

[57] ABSTRACT

A Lange coupler device which includes a first layer which is a base substrate of a dielectric material such as alumina. Deposited on this substrate are second, third and fourth layers of the device. Each layer is made from a thick-film material. The second layer is a conductive layer, arranged in five parallel lines. One of the outermost lines is connected to the center line at one end of the substrate while the other outermost line is connected to the center line at the opposite end of the substrate. This leaves two lines unconnected at this layer. The third layer is a dielectric layer which has through-holes to: 1) each end of the unconnected lines of the bottom layer, 2) the unconnected ends of the outermost lines and, 3) the middle of the center line. The fourth layer of material is a conductive layer. The fourth layer is arranged as three parallel lines, each perpendicular to the lines of the second layer. The conductor lines of the fourth layer connect and extend through the holes of the dielectric layer to the lines of the second layer, forming the complete circuit.

12 Claims, 2 Drawing Sheets

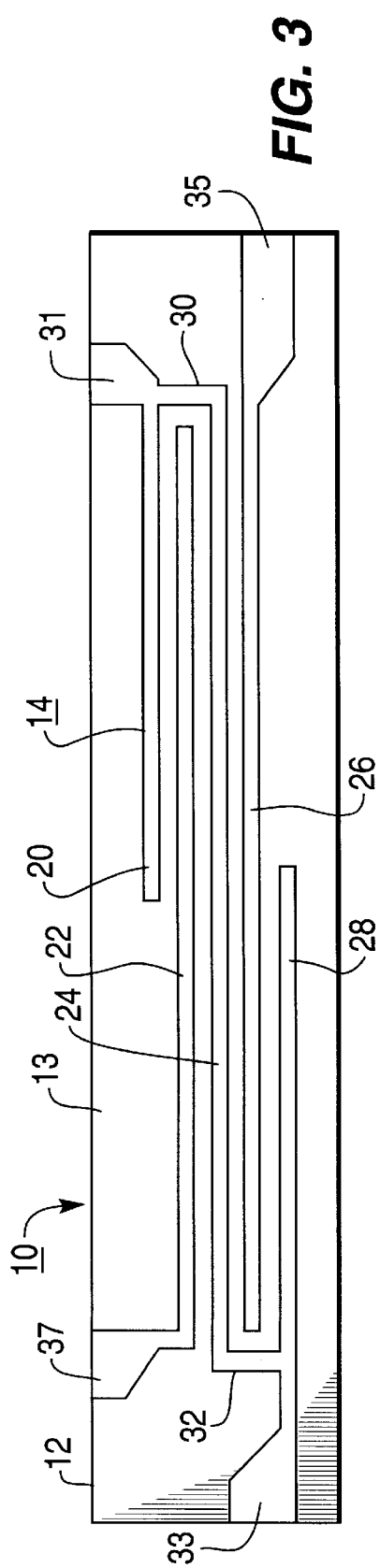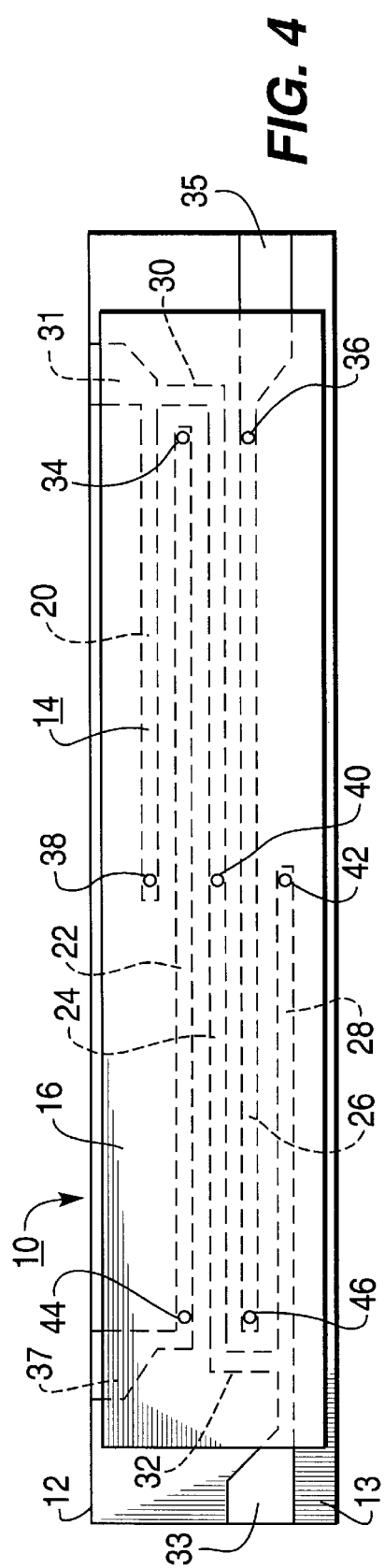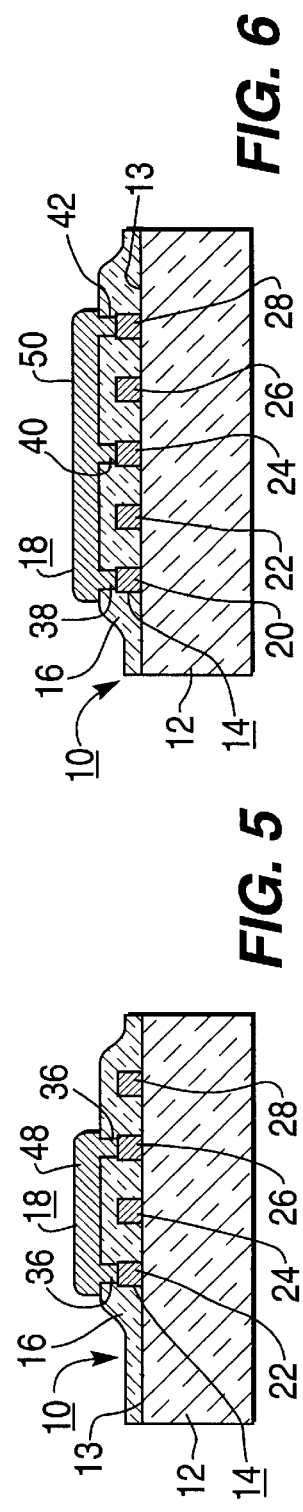

THICK FILM LANGE COUPLER

FIELD OF THE INVENTION

The present invention relates to a thick-film Lange coupler, and, more particularly, to a thick-film Lange coupler in which all the lines are electrically connected by connections made from thick-film material.

BACKGROUND OF THE INVENTION

Passive power couplers are one of the fundamental building blocks used in many high frequency signal processing designs. Applications include balanced mixers and amplifiers, phase shifters, attenuators, modulators, discriminators, filters, delay lines, and matching networks. The low cost and reliability of these structures make them useful in many communications, radar, telemetry and electronic warfare devices.

Couplers can be constructed using a variety of transmission line configurations, including coaxial, stripline, and waveguide. One of the most widely used configurations is microstrip. This common printed circuit board technology consists of a single strip of conductor of a particular width and thickness separated from a ground plane by a dielectric layer. This structure is popular because it is inexpensive to fabricate and allows for easy mounting and inspection of components.

Small, octave and multi-octave microstrip couplers are often fabricated using parallel-coupled lines. A popular structure used when tight coupling is required (3–6 db) is the interdigital or Lange Coupler. Due to the line length, line width and line spacing requirements of these devices, these devices are typically built using common thin-film technology.

Referring to FIG. 1, there is shown one form of a prior art Lange coupler 51. Trace lines 52, 54, 56, 58, 60 are deposited on a surface 51 of a base substrate 50. The trace lines 52 through 60 may be deposited using a well known thin-film technique. The trace lines 52 through 60 are arranged in five parallel lines, with line 52 and 56 connected by a thin-film connector line 62 and lines 56 and 60 connected by a thin-film connector line 64. The trace lines of the coupler 51 are kept at the same potential by connecting the common lines periodically along the length of the device. These connections are made using wire bonds or air bridges 66 through 72. Referring again to FIG. 1, wire bonds 66, 68, 70 and 72 are connected by welds or ultrasonic bonds at points 74, 76, 78, 80, 82, 84, 86 and 88. The wires are arranged to connect only alternate trace lines. Adjacent trace lines remain electrically isolated from each other.

This device is expensive to build due to the thin-film process and the bonds required. Also, the bonds are fragile, resulting in special packaging for the device.

Thick film technology offers an attractive solution to the problems of cost and durability of the thin film Lange Coupler. Compared with thin-film, thick-film technology are inexpensive. They can be produced on low cost fired substrates using simple equipment. Batch operations that produce multiple parts are common and simple to implement and tooling costs are low. The circuits are very rugged and can be encapsulated easily and inexpensively using an over-glaze. This encapsulation, in addition to protecting the Lange trace lines, increases the effective dielectric constant of the circuit. This, in turn, reduces the electrical length of the ¼ wave device. This results in a smaller, more compact, device than would be necessary if the encapsulation were not present. Also, the encapsulation increases the edge coupling between trace lines. This reduces the required distance between the trace lines and therefore reduces the difficulty of manufacturing the device. Therefore it would be desirable to have a Lange coupler which is made entirely of thick-film material.

SUMMARY OF THE INVENTION

The present invention is directed to a device which comprises a first layer of a dielectric material. On said first layer is a second layer of a conductive thick film material, arranged in a plurality of parallel lines, with every other line connected by a line on opposite ends of the substrate. On the second layer is a third layer made of thick-film dielectric material. The third layer has through-holes placed over the lines of the second layer below. The through-holes are placed over each of the unconnected ends of the lines of the second layer. One through-hole is also placed over the center of the center line of the second layer below. On the third layer is a fourth layer, made of a thick-film conductive material, arranged in parallel lines perpendicular to the lines of the second layer, which connect and extend through the holes of the third layer.

BRIEF DESCRIPTION OF THE DRAWINGS

FIG. 3 is a top plan view of the thick-film Lange coupler of the present invention with the third and fourth layers removed;

FIG. 4 is a top plan view of the thick-film Lange coupler of the present invention with only the fourth layer removed;

FIG. 5 is a cross-sectional view of the thick film Lange coupler of the present invention taken across line 5—5 of FIG. 2;

FIG. 6 is a cross-sectional view of the thick-film Lange coupler of the present invention taken across line 6—6 of FIG. 2.

DETAILED DESCRIPTION OF THE DRAWINGS

Figure 2:
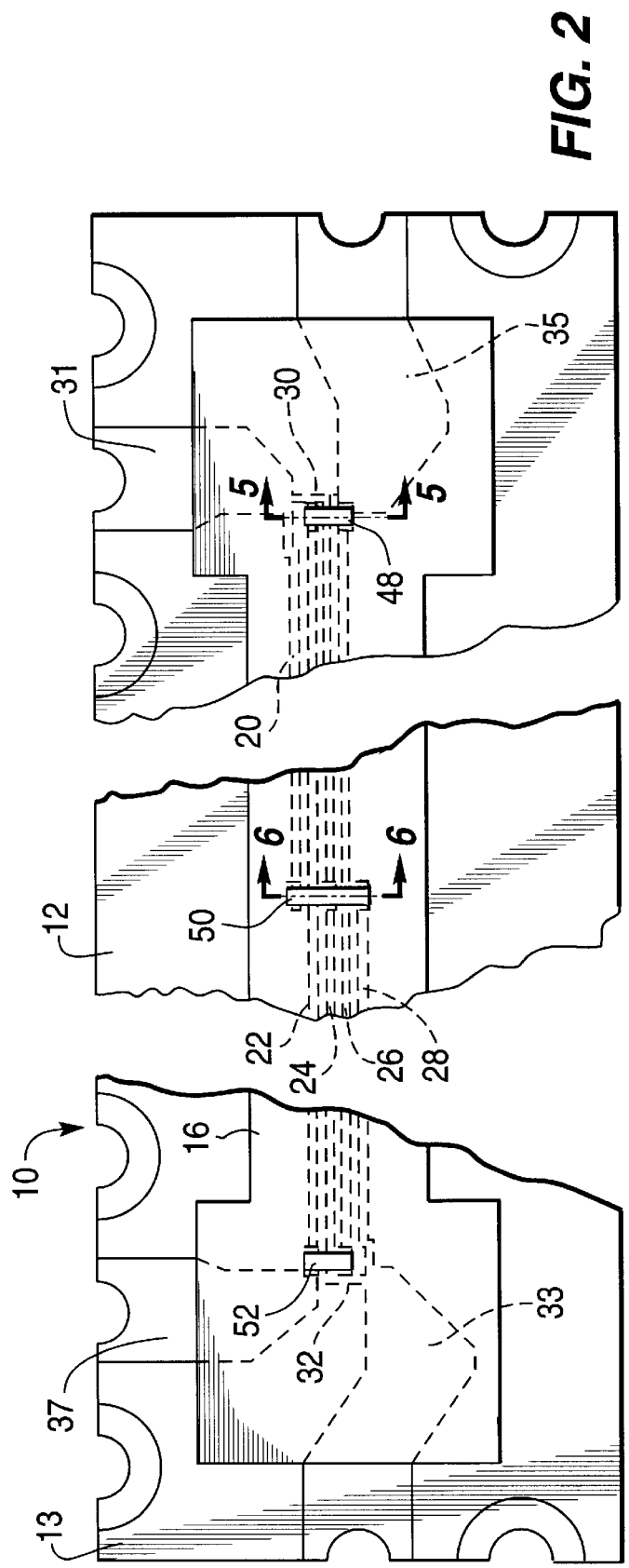
FIG. 2 is a perspective view of the thick-film Lange coupler of the present invention.

Referring to FIG. 2, there is shown one form of the thick-film lange coupler device 10 of the present invention. the coupler 10 is rectangular in shape and includes as a first layer, a base substrate 12 of a dielectric material such as alumina. The substrate 12 has on a surface 13 thereof second, third and fourth layers 14, 16 and 18, superimposed on the first layer 12. The second layer 14 is made of a conductive thick film paste. This paste is preferably made of a precious metal such as silver or platinum, a glass and an organic carrier. It is preferably applied to the substrate 12 using a well known silk screening method. The device is then subjected to heat so that the carrier is burned away, leaving only the metal and glass mixture, dried in a particular pattern. The device is then fired in a kiln at a temperature preferably between 500 and 1000 degrees Centigrade, allowing the remaining metal and glass to form an amalgam that has conductive properties. The third layer 16 is silk screened on top of the second layer 14 and is made of a dielectric thick film paste. This paste is preferably made of a material such as a barium or bismuth oxide, glass and an organic carrier. It is applied and processed in the same manner as the second layer 14. The fourth layer 18 is made of a conductive thick-film material similar to that of the second layer 14, and is applied and processed in a similar manner.

As shown in FIG. 3, the second layer 14, made of conductive thick-film material, is arranged in a pattern of five parallel lines 20, 22, 24, 26, 28. Line 20, one of the outermost lines, and line 24, the center line, are connected by a connecting line 30 at one end of the substrate 12. Line 24, the center line, and line 28, the other outermost line, are connected by a connecting line 32 at the opposite side of the substrate 12. Output terminals 31 and 33 extend from the connecting lines 30 and 32 respectively, and output terminals 35 and 37 extend from the ends of lines 26 and 22 respectively. These connecting lines 30, 32 and output terminals 31, 33, 35 and 37 are made of the same material as the lines 20, 22, 24, 26, 28 and are applied and processed in the same manner and at the same time as the lines 20, 22, 24, 28, 28.

As shown in FIG. 4, the third layer 16, a layer of dielectric thick-film material, is laid on top of the second layer 14. This third layer 16 is solid except for through-holes 34, 36, 38, 40, 42, 44 and 46. These holes go through the dielectric layer 16 to the conductive material of the second layer 14 there below. Hole 38 is placed over the unconnected end of line 20, holes 34 and 44 are placed at opposite ends of line 22, hole 40 is placed over the middle of line 24, holes 36 and 46 are placed at opposite ends of line 26 and hole 42 is placed over the unconnected end of line 28. The diameter of the through-holes is large enough to create a proper electrical connection when a conductive layer is laid on top of them, but small enough so that the holes cover one and only one conductor line of the said second layer 14.

Referring back to FIG. 2, the fourth layer 18 is placed on the surface 17 of the third layer 16 and extends through the holes 34 through 46 in the third layer 16 to the second layer 14. The material of the fourth layer 18 is made of conductive thick film paste similar to the second layer 14. This fourth layer 18 is processed in the same manner as the second layer 16.

Fourth layer 18 is arranged in three parallel lines 48, 50 and 52. These lines are perpendicular to lines 20 through 28 of the second layer 14. Line 48 is placed to connect and extend through holes 34 and 36 of the third layer 16. As shown in FIG. 5, line 48 connects and extends through holes 34 and 36 of third layer 16 to lines 22 and 26 of the second layer 14. In this manner, line 48 creates an electrical connection between lines 22 and 26 of the second layer 16. Line 50 is placed to connect and extend through holes 38, 40 and 42 of the third layer 16. As shown in FIG. 6, line 50 connects and extends through holes 38, 40 and 42 to the lines 20, 24 and 28 of the second layer 14. In this manner, line 50 creates and electrical connection between lines 20, 24 and 28. Line 52 is placed to connect and extend through holes 44 and 46 of the third layer 16. This creates and electrical connection between lines 22 and 26 of second layer 14 similar to that created by line 48.

Figure 1:
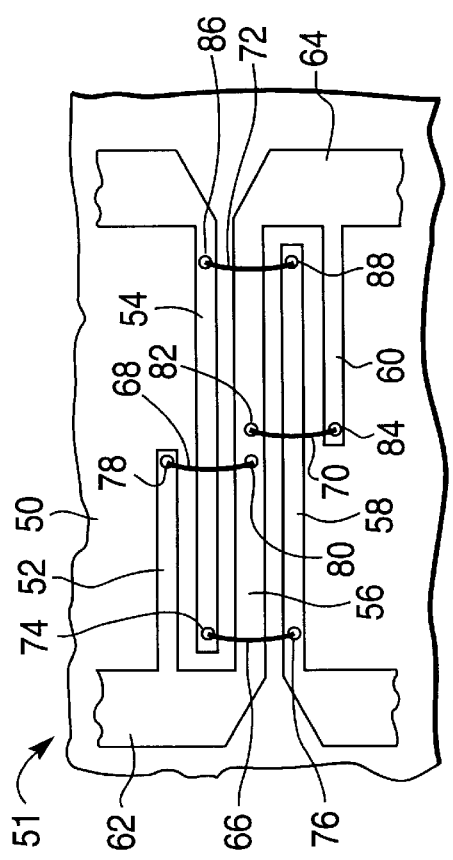
FIG. 1 is a top plan view of the prior art.

Rather than using wire bonds to connect thin-film trace lines as shown in FIG. 1 of the prior art, the thick-film Lange coupler 10 of FIG. 2 uses thick-film technology to create the trace lines and the connections between the trace lines and thick-film dielectrics to electrically isolate the unconnected trace lines. This results in a Lange coupler that is more durable than the prior art because the wire bonds, which are fragile and easily broken, have been replaced. The thick-film Lange coupler requires less intricate and expensive packaging than the prior art, as a simple over-glaze can be used to protect the device. Thick-film technology is less expensive than thin-film technology due to lower tooling and processing costs. Also, thick-film technology can be used in large batch processes. The result is a Lange coupler device which is more durable and less expensive than the prior art.

What is claimed is:

1. A Lange coupler device comprising:
   a first layer of a dielectric material;
   a second layer of a conductive material on the first layer and arranged in a plurality of parallel lines, with alternate lines being electrically connected by a connecting line at opposite ends of the device;
   a third layer of a dielectric material on the second layer which electrically isolates the unconnected lines of the second layer and has through-holes to the conductor lines of the second layer, and
   a fourth layer of a conductive material on the third layer and arranged in a plurality of parallel lines, perpendicular to the lines of the second layer, the lines of the fourth layer extending through the through-holes in the third layer and connecting the lines of the second layer.

2. The Lange coupler of claim 1 wherein the first layer of dielectric material is an alumina substrate.

3. The Lange coupler of claim 2 wherein the second layer of material is a conductive thick-film paste.

4. The Lange coupler of claim 3 wherein the third layer of material is a dielectric thick-film paste.

5. The Lange coupler of claim 4 wherein the fourth layer of material is a conductive thick-film paste.

6. The Lange coupler device of claim 5 wherein said conductive thick-film paste is a precious metal dispersed throughout a glass.

7. The Lange coupler device of claim 6 wherein said dielectric thick-film paste is a glass.

8. The Lange coupler device of claim 7 wherein said second layer is arranged in five parallel lines with one outermost line connected with the center line at one end of the substrate and the other outermost line connected with the center line at the opposite end of the substrate.

9. The Lange coupler device of claim 8 wherein said third layer is solid and has seven through-holes to the conductive layer below.

10. The Lange coupler device of claim 9 wherein said through-holes are placed as follows:
    one over each of the unconnected ends of the conductor lines of the second layer and,
    one over the middle of the center conductor line of the second layer.

11. The Lange coupler device of claim 10 wherein said fourth layer is arranged in three parallel lines, each line being perpendicular to the lines of the second layer and each line connecting two or more holes of the third layer below.

12. A Lange coupler device comprising:
    a substrate of an insulating material having a surface;
    five parallel lines of a conductive thick-film material on said surface of the substrate;
    a first connecting line of a conductive thick-film material on said surface of the substrate and extending between and electrically connecting an end of one of the outermost lines to an end of the center line;
    a second connecting line of a conductive thick-film material on said surface of the substrate and extending between and electrically connecting an end of the other outermost line to the other end of the center line;

a layer of a thick-film dielectric material over the five parallel lines;

a plurality of holes through said dielectric layer to the unconnected ends of the parallel lines on the substrate and to the middle of the center line;

a layer of a conductive thick-film material on the dielectric layer and arranged in a plurality of parallel lines perpendicular to the parallel lines on the substrate, each of the lines of the layer extending through holes in the dielectric layer so that a separate one of the lines connects the unconnected ends of the completely unconnected lines, and another one of the lines connects the middle of the center line to each of the unconnected ends of the outermost lines.

\* \* \* \* \*